United States Patent [19]

Roos

[11] 4,281,396
[45] Jul. 28, 1981

[54] MAGNETIC STRIP DOMAIN MEMORY SYSTEM

[75] Inventor: Jan Roos, Eindhoven, Netherlands

[73] Assignee: U.S. Philips Corporation, New York, N.Y.

[21] Appl. No.: 859,058

[22] Filed: Dec. 9, 1977

[30] Foreign Application Priority Data

Jan. 25, 1977 [NL] Netherlands ............... 7700270

[51] Int. Cl.$^3$ ............................................. G11C 19/08
[52] U.S. Cl. ........................................ 365/29; 365/10; 365/2; 365/32
[58] Field of Search .......................... 365/3, 29, 32

[56] References Cited

U.S. PATENT DOCUMENTS

| 3,710,356 | 1/1973 | Bobeck et al. | 365/29 |
| 3,940,750 | 2/1976 | Voegeli | 365/29 |
| 4,001,794 | 1/1977 | Voegeli | 365/29 |
| 4,122,538 | 10/1978 | Lins | 365/29 |

OTHER PUBLICATIONS

IEEE Transactions on Magnetics—vol. Mag-9, No. 4, Dec. 1973 pp. 617-621.
IBM Technical Disclosure Bulletin-vol. 18, No. 8, Jan. 1976, pp. 2673—2674.
IBM Journal of Research & Development—Jul. 1976, pp. 368–375, vol. 20 No. 4.

Primary Examiner—James W. Moffitt
Attorney, Agent, or Firm—Marc D. Schechter

[57] ABSTRACT

A magnetic memory device in which information is stored in the form of strip domains in a layer of magnetic material supported by a layer of ferromagnetic material. The ferromagnetic material contains a pattern of alternately magnetized strips for sustaining a magnetic field periodically varying in a first coordinate direction and directed transverse to the domain layer. The device also includes a generator for receiving and converting data into configurations of the strip domains in the plate.

12 Claims, 27 Drawing Figures

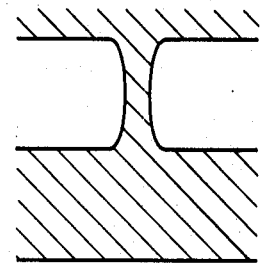
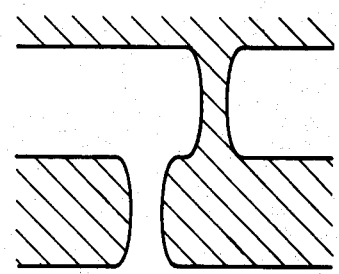
Fig. 7  Fig. 8
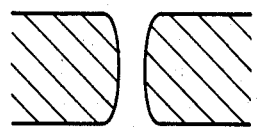
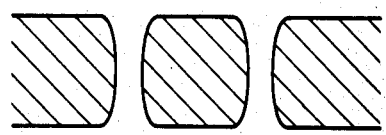
Fig. 9  Fig. 10
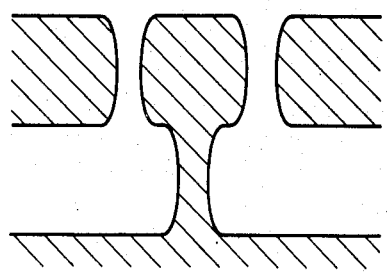
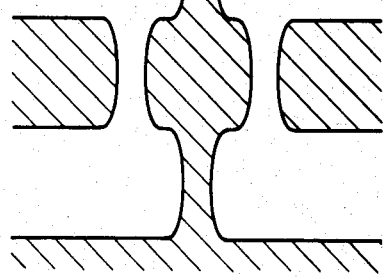
Fig. 11  Fig. 12

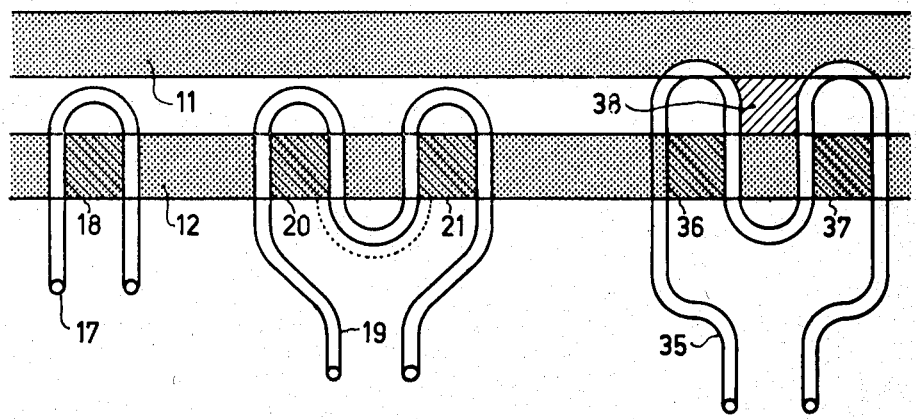
Fig. 16  Fig. 17  Fig. 18
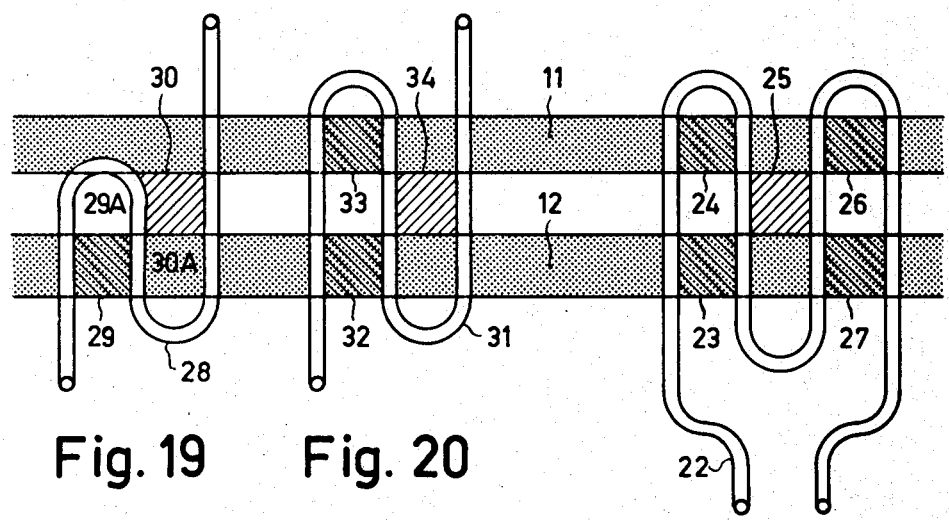
Fig. 19  Fig. 20
Fig. 21
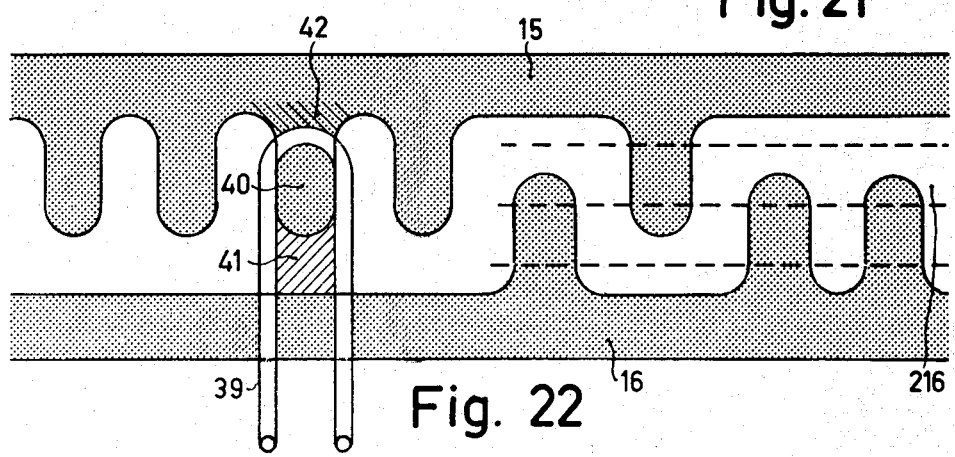
Fig. 22

MAGNETIC STRIP DOMAIN MEMORY SYSTEM

BACKGROUND OF THE INVENTION

The invention relates to a memory device comprising a domain layer of magnetic material for accommodating a two-dimensional configuration of magnetic domains having a first magnetization direction transverse to said layer, the domain configuration being embedded in a two-dimensional configuration of a background region having a second magnetization direction which is opposite to the first magnetization direction in the domain layer. Such a memory device further comprises generating means, including an input for receiving digital data, for selectively generating, under the control of the data, the two-dimensional configurations of magnetic domains and background region, respectively, and also comprises external bias means for sustaining a bias magnetic field configuration, having a field component transverse to and in the first layer of magnetic material, in order to stabilize the two-dimensional magnetic domain and background region configurations therein. The memory device also comprises detection means for detecting digital data embodied in at least one of the two-dimensional configurations. A device of this kind is known from the article by B. A. Calhoun et al entitled "Column Access of a Bubble Lattice: Column Translation and Lattice Translation", IBM Journal of Research and Development, July 1976, pages 368-375. The known device comprises means for generating an overall, substantially uniform bias magnetic field in a direction transverse to the plane of the plate, for example, by a permanent magnet. A magnet of this kind is usually rather heavy and the invention in this respect aims to provide a memory device based on such magnetic plate materials without requiring a uniform background magnetic field. This results in a device whose weight is lower than that of the known device. Furthermore, in the known device digital data is embodied in the magnetic structure (states) of the walls of the more or less disc-shaped domains. "Hard" as well as "soft" bubble domains occur. Many of the known techniques for the detection of magnetic domains, and hence for the discrimination between the different data contents of the domains, cannot be used in these circumstances, because such techniques detect the presence or absence of the domain walls, not the states thereof. Methods of this kind are based, for example, on the Faraday effect or the magnetoresistance effect. In the device of the above article, discrimination between the various categories of magnetic bubbles can be effected by placing the domain layer in a magnetic field having a gradient. The direction of movement of domains is then dependent of the magnetic structure of the domains' walls. The known memory device, consequently, requires a complex extraction device in which the domains must travel a preselected free path before they are sent into one of two or more detectors under the influence of their different directions of movement.

SUMMARY OF THE INVENTION

In this respect, the invention aims to provide a memory device in which digital data is embodied in the presence or absence of domain walls, with the result that both stationary and moveable domains can be detected. An object of the invention is to provide a memory device having a high data density, in that in a predetermined coordinate direction directly successive pairs of domain walls have to be spaced apart by only one "bubble" diameter. Another object of the invention is to provide a general, spatially regular bias magnetization configuration in the first layer of magnetic material. The invention aims to provide a memory device with non-volatile data storage.

The objects of the invention are achieved in that the external bias means comprise a layer of a ferromagnetic material, approximately parallel to the domain layer, having a magnetization configuration which is spacially periodic in the domain layer in a first coordinate direction along the domain layer, and which is directed transverse relative to the domain layer. The magnetic field configuration has a first period in the first coordinate direction, and has peak value regions which extend strip-like in a second coordinate direction transverse to the first coordinate direction. The peak value is suitable to stabilize a locally present domain region having a magnetization direction opposite to the direction of the peak bias field. The resultant magnetic field has a mean value transverse to the plate which is small relative to the peak value in that this magnetic field comprises two oppositely directed portions per period in the first coordinate direction so that generally the areas of the magnetic domains and the areas of the background regions are approximately equal. Generating means is provided for introducing digital data into the magnetization configuration of the domain layer of magnetic material. For storing digital data, the generating means utilizes first domain/background region walls extending substantially in the second coordinate direction, and second domain walls which extend substantially along the first coordinate direction and which are selectively arranged. Pairs of second domain walls which succeed each other within a strip in the second coordinate direction are spaced a substantially integral number of transverse periods apart. In the state where no information is being stored in the domain layer, said layer comprises a series of strip domains of alternating magnetization. The magnetization alternates in the first coordinate direction and the strips extend in the second coordinate direction. Information can be imparted to the strip domains by creating interruptions in strips and by creating protrusions from strips. The value of the first periods and of the transverse periods (along the second coordinate direction) are of the same order of magnitude. The pairs of second domain walls are present in positions forming a two-dimensional regular array. The layer of ferromagnetic material may have a low weight and may be constructed, for example, as a magnetic tape such as is commonly used for the storage of digital data. Detection can be accomplished by using an optically sensitive element which determines the Faraday rotation in a row of positions along the second coordinate direction. The detector thus distinguishes between the presence or absence of transitions between domain regions and background regions (with different Faraday rotations). Other detection methods utilize the magnetoresistance effect. Finally, for example, destructive reading is also possible by selectively collapsing domains.

Preferably, the first and second coordinate directions are rectangular coordinate axes. This results in a simple system. Another system utilizes, for example, rotationally symmetric external magnetic field configurations, the coordinate directions being polar coordinates.

Preferably, two second domain walls which directly succeed each other in the second coordinate direction interrupt a strip of domain region having a first magnetization direction. In that case domain shapes other than the disc-shaped type are possible. It will be shown that this can result in many different combinations. Part of a strip of domain region can be separated by successive pairs of second domain walls. This separated part can be connected to an adjoining strip of domain region by further domain walls as if it were via a bridge. Further bridges and/or interruptions in the adjoining strip or strips make many different combinations possible. For example, a separated part of a strip of domain region can have a dimension of one bubble diameter in the second coordinate direction, and thus contain a plurality of data bits. An extremely high data density is thus realized.

It is possible for the domain layer of magnetic material to exhibit, in the absence of external bias magnetic means, spatially alternating magnetization directions with strip widths of a predetermined standard value range. In such a case the first period of the ferromagnetic layer is made larger than twice and smaller than four times the standard value. The facing domain/background region walls of two adjoining strips of the first magnetization direction then alternatively comprise protrusions in order to embody the digital data. The transverse dimensions of the protrusions corresponding substantially to the standard value. In this system, the data is embodied in the local presence or absence of a protrusion from a strip of domain region. This also results in a stable configuration having a high data density.

Preferably, in addition to a first bias field which is periodic in the first coordinate direction, further external bias means are provided for sustaining in the domain layer of magnetic material a further magnetic field configuration with a field component transverse to the domain layer of magnetic material. This field is superposed on the first bias magnetic field configuration and has a spatially periodic variation with a third period in the second coordinate direction, the amplitude of the variation being of the same order of magnitude as the periodic variation of the magnetic field configuration in the first coordinate direction. The further bias magnetic field configuration can serve to stabilize the two-dimensional regular array. The amplitude may differ from that of the first magnetic field configuration, for example, it may be three times smaller. However, it may also be nearer to that of the first magnetic field configuration, and it may even be higher. The third period may be substantially equal to the transverse period, and it may also be, for example, an integral number of times larger.

Preferably, there are provided first propagation means for driving the two-dimensional configuration of magnetic domains and background region. The means are present in a predetermined region of the domain layer of magnetic material, relative to the layer of ferromagnetic material in the first coordinate direction transverse to the strips. Propagation means of this kind are known per se from the article. This article describes a hexagonal array, where driving is accomplished by activation of conductors which extend parallel to a row of domains of the domain array. Driving is at an angle of 60° with the first coordinate direction. According to the invention, this angle may be 60°, 90°, or some other value. Moreover, such propagation according to the invention is adequate to present a row of domain data to a detector element. This element can detect the domain configurations, for example, by the Faraday rotation of polarized light while utilizing optical addressing. This offers the possibility of random addressing. In the known technique this possibility does not exist, because domain data can be retrieved only by movement of the domain incorporating the data, for which purpose domains must be extracted from the array. Preferably, the first propagation means comprise current conductors which extend in the second coordinate direction along the first layer of magnetic material and which are connected to outputs of a first current generator. The current conductors are periodically arranged, according to a fourth period in the first coordinate direction, in order to drive one strip of a magnetization direction of the two-dimensional configurations, and hence indirectly by repulsion between adjoining strips, the entire magnetization configuration, in the predetermined region. It has been found that by means of such propagation means a two-dimensional region comprising domain configurations which deviate from the standard bubble domains can be advantageously driven.

Preferably, for the input and/or output of digital data, embodied in a magnetization configuration, to or from the predetermined region, there is provided a communication strip which adjoins the predetermined region on at least one side along the second coordinate direction. There is also provided second propagation means for driving, along the communication strip, a magnetization configuration which comprises at least one strip of domain region which is isolated from further strips of domain region adjacent the communication strip. A data converter is associated with at least one point of the communication strip and the second propagation means is connected to an output of an activation unit which is connected, together with the current generator, to outputs of a control device. Second propagation means of this kind are known per se from the article. A comparison of the FIGS. 5 and 7 of the article reveals, however, that upon departure from the array region, the magnetic domains must suddenly enter a higher field in order for the bubble domains to remain stable. This departure, on the other hand, is required in order to achieve the already described "free" movement towards the detector unit. However, a movement against an increasing background magnetic field may be objectionable. In accordance with the invention, there is no background magnetic field so that it need not be applied outside the storage region of the domain configuration either.

Hereinafter, the invention will be described in detail, in the following order of discussion: the general construction of a memory device according to the invention, the different types of magnetization configurations to be used in such a device, the generating of the domain configurations, the displacement of the domain configurations, and the extraction of the digital data contained therein. The invention will also be described with reference to the accompanying drawings.

BRIEF DESCRIPTION OF THE DRAWINGS

FIGS. 7–15 are cross-sectional views of nine different magnetization configurations.

FIGS. 16–22 are top plan views of seven different magnetization configuration generators.

DESCRIPTION OF THE PREFERRED EMBODIMENTS

General Construction

Figure 1:
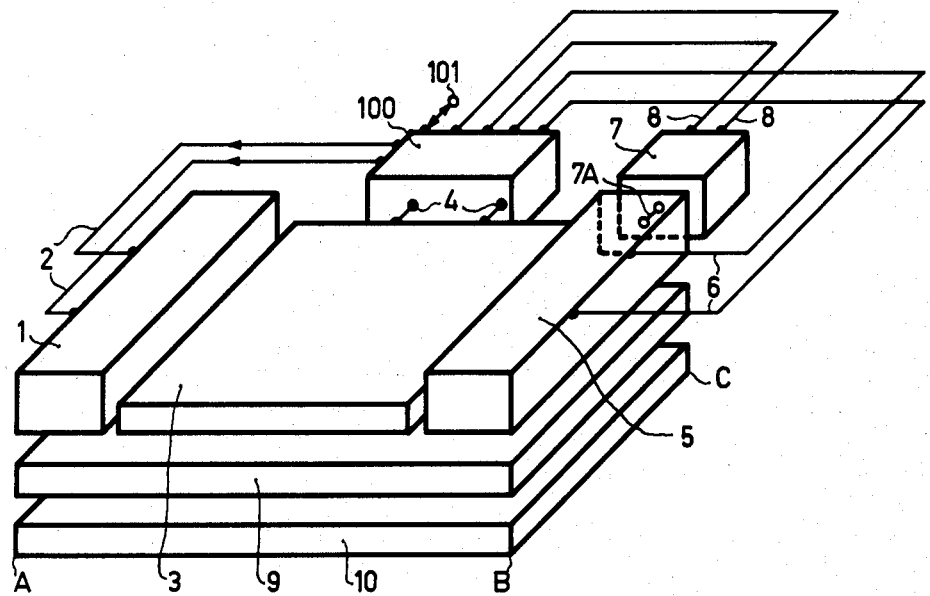
FIG. 1 is a schematic representation of a first memory device according to the invention.

FIG. 1 is a perspective view of a memory device according to the invention, comprising a data converter 1, having data input terminals 2, a propagation device 3 with drive control terminals 4, a data extraction device 5 (for example a meander conductor, described below with respect to FIG. 23) having control terminals 6, a detection device 7 having a data input 7A and data output terminals 8, a plate of magnetic material 9 in which magnetic domains can be sustained, and a layer of ferromagnetic material 10 which has a fixed magnetization pattern as will be described hereinafter. The memory device further comprises a control device 100, having an external data line 101. The control device is also connected to the terminals 2, 4, 6, 8. The line 101 can transport data in two directions and is connected, for example, to a user device such as a central processor unit (cpu) which will not be described herein, a channel or the channel control unit, or to another user device. The data received may comprise control signals and data signals. This data can be organized in data words, data bytes or otherwise. In this example, the memory device operates as a first-in-first-out (FIFO) buffer. The data received may contain, for example, a write control signal and a data word. In reaction thereto, the control device 100 can store the data word in known manner in a data register and despatch it to the data converter 1, possibly utilizing series/parallel techniques. The data converter 1 then supplies magnetization signals in order to influence the magnetization configuration in a strip-shaped region of the layer of magnetic material 9. An accurate description of the geometrical magnetization patterns will be given hereinafter. After writing the data into a strip of the layer 9, the driving device 3 supplies, under the control of signals to the terminals 4 from the control device 100, magnetic field signals such that the row of data formed is driven to the right over one period of the magnetization of the ferromagnetic layer 10 which is periodic in the direction A-B.

As regards the device 1, a full period of operation has been completed so that a new strip of data can be stored under the control of appropriate signals on the terminals 2. Subsequently, both strips are driven to the right over one period of the structure in the layer 10. After that, a further period may begin. It is possible that no data may be written into the layer 9 during a given period. This may be identical, for example, to zero information (000 ..0).

When, after a number of periods of such control, a strip of the magnetization configuration of the layer 9 reaches the extraction device 5, this device can extract, under the control of control signals received from the control device 100 on the lines 6, the data embodied in the strip of the magnetization configuration of the layer 9 in the direction of the detection device 7. The nature of this extraction will be described hereinafter. The data thus pass the connection 7A. The detector 8 converts the data received into data signals, for example, electrical pulses, and supplies these signals on its output terminals 8. In the control device 100 these signals can be either transported further via the external data line 101, or be stored again via the lines 2, with or without modification by signals from the user device received in the control device 100 via the line 101. Thus, a buffer device which has been coupled end-around has been formed. The exact arrangement of the elements 1, 3, 5, 7 relative to each other will be described hereinafter.

The device can be modified in various manners. For example, layer 9 may be a comparatively large plate 9 magnetic material on which a plurality of extraction devices 5 are provided. These devices are then separated from each other by a driving device 3. The data can then be extracted in a plurality of locations on the plate 9. Upon extraction, on the one hand, part of the magnetization configuration can be driven in its entirety in the direction BC. Detection is thus effected on one side of layer 9. On the other hand, the data in a strip of the magnetization configuration can also be extracted therefrom in parallel. The devices 5, 7 may then comprise, for example, a parallel/series converter and a pulse converter. The data can also be serially input into the magnetization pattern of the layer 9, after which the relevant strip is driven at the area of the device 1 in the direction CB until it reaches its ultimate position. The detection of the magnetization configuration can also be effected over a two-dimensional region in a parallel mode. The two-dimensional region is to be understood to be large with respect to a standardized "bubble" domain diameter to be described hereinafter.

Figure 2:
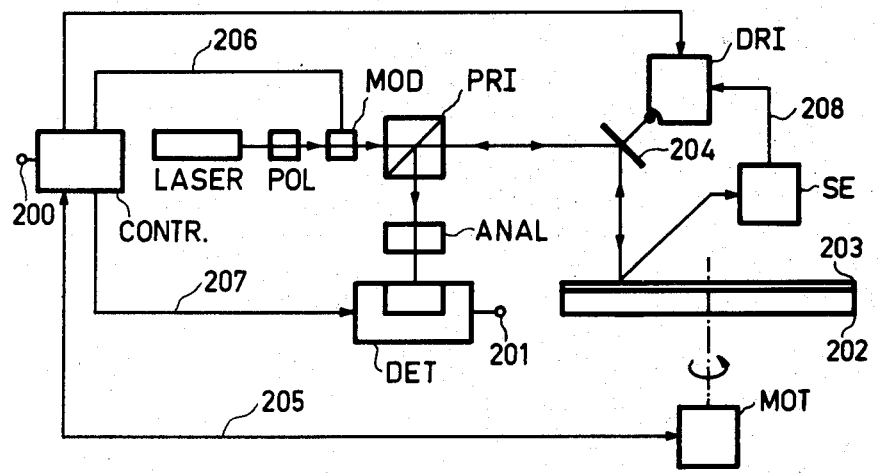
FIG. 2 is a schematic representation of a second memory device in accordance with the invention.

FIG. 2 is a general view of a second memory device according to the invention. In this embodiment, the magnetization configurations are stationary relative to the layer of magnetic material. The memory device comprises a control device CONTR, having a signal input 200, a light source LASER, a polarizer POL, a modulator MOD, a prism PRI, an adjustable mirror 204, an adjusting device DRI, a position determining unit SE, a memory disc of magnetic material 203, having a substrate 202, a driving device MOT, an analyser ANAL, a detector DET and a signal output terminal 201. The disc 203 is suitable for storing data in the form of magnetic domains, the data being organized along concentric tracks. The disc may consist of a single crystalline plate. On the other hand, it may also consist of a number of crystals, each of which fills, for example, a sector of the plate or a part thereof. The layer 202 primarily serves for reinforcement. To this end, it comprises a layer of a rigid synthetic material having a thickness of, for example, 3 mm. This layer is not separately shown. The layer 202 further comprises a layer of permanent ferromagnetic material whereby a bias magnetic field configuration yet to be described is sustained in the layer 203. A configuration of magnetic domains or background region present in the plate 203 is thus stabilized. The layer 202 (which may also comprise further sub-layers not described) rotates with the layer 203 at a uniform speed, driven by the driving device MOT via a shaft which is denoted by a broken line. The line 205 is active in two directions, so that a control loop is formed and the driving device MOT is adjusted to a standard speed. If the deviation from the standard speed is too large, the control device CONTR receives a blocking signal via the line 205. During a read operation, the terminal 200 receives address data from a user device (not shown) whereby a given radial position or a number of radial positions are addressed. The address data are applied to the adjusting device DRI. This device provides adjustment of the mirror 204 which is rotatable about an axis which extends perpendicularly to the plane of the drawing. As a result, a light beam can be digitally deflected as shown over a predetermined angle, so that the desired radial position is addressed.

The light source LASER continuously emits light which is polarized by the polarizer POL and which is modulated, if necessary, by the modulator MOD under the control of signals on the line 206. First of all, the modulator can be unblocked only if a read operation is to be performed and if, moreover, the mirror 204 is positioned on the correct track. The latter signaling is not shown. Furthermore, a tangential address can also be received on the terminal 200, so that only a given sector of a track is read. The detector DET receives clock pulse information from the control device CONTR. Synchronous detection of the data of the passing domain configuration is then possible. The polarized and modulated light of the light source LASER reaches, via the prism PRI and the adjustable mirror 204, the transparent plate of magnetic material 203. Between the layers 203 and 202 there is provided a reflective layer which is not shown. The Faraday rotation of the polarized light occurring in the layer 203 is dependent on the presence of a domain or a background region. The light is reflected from the interface of the layers 203 and 202, and is subjected to a further Faraday rotation in the layer 203. Subsequently, it reaches the prism PRI again via the mirror 204. This prism comprises a semi-transparent mirror which is arranged according to the diagonal shown. Subsequently, the reflected light reaches the detector DET via the analyzer ANAL. The signals on the line 205 may also indicate an angular position of the disc. On the basis thereof, the signals on the lines 206, 207 can correspond exactly to the positions of a given domain configuration in order to reduce the sensitivity to noise effects. The adjusting device can also receive signals from the position determining unit SE to enable fine adjustment. On the one hand, this fine adjustment may concern the distance from the memory disc 202/203. It may also concern fine adjustment to the correct track in which case a control loop is then formed via the line 208. The polarizer POL and the analyser ANAL transmit light having a preselected polarization, and substantially completely block light having a polarization perpendicular thereto. The positions of the elements POL and ANAL are chosen so that adequate contrast occurs between the transmitted quantities of light upon passage along a point where a domain is present and a point where no domain is present. The device DET can further comprise a level discriminator which can supply a "0" signal and a "1" signal: this signal then appears on the signal output 201 in order to be supplied to the user device.

Because the presence of a domain or background region constitutes digital data, a given interval will always to be detected as "0" or "1" by the detector. As a result, there is a tolerance region for the various elements of the system. A further operating mode of the system is where the detector comprises a differentiating input so that the transitions between domain region and background region are detected. The operation of the system may be similar for write operations, except for the analyser ANAL and the detector DET. The physical mechanisms of the write operations, however, will be described hereinafter.

The Various Magnetization Configurations

Figure 3:
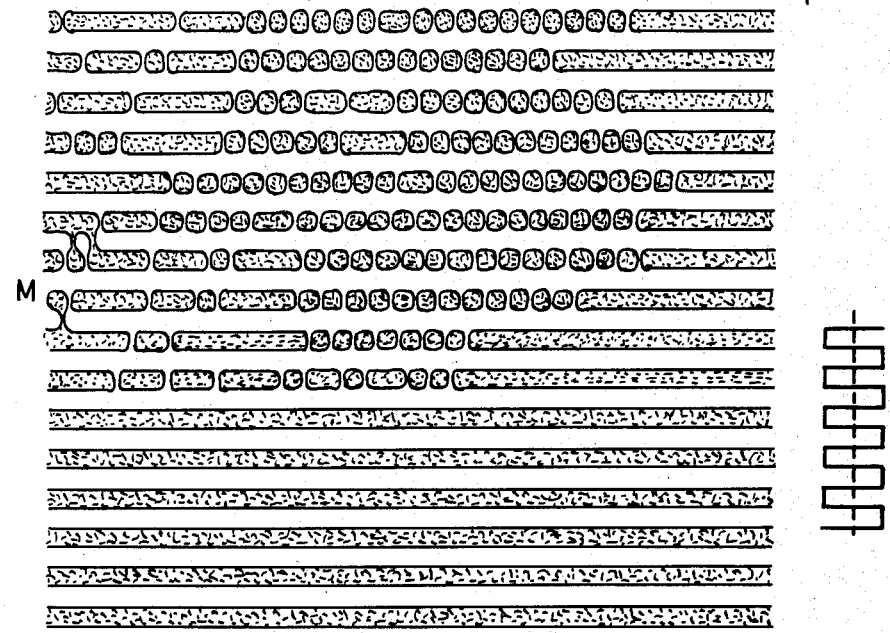
FIGS. 3–6 show four different magnetization configurations according to the invention.

FIG. 3 shows a first magnetization configuration of the layer 9 of FIG. 1. The magnetization is made visible in the figure by the Faraday-effect. For example, the dark region may be defined as magnetic domains and the light region as background region, but this choice is arbitrary. Thus, the border lines in the figure are interfaces which extend substantially transverse to of the plane of the plate. The border lines thus visible are either closed in themselves, or terminate in a different manner at the edge of the plate of magnetic material. The latter, however, is not considered. In this example, use was made of a substrate layer of gadolinium gallium garnet (GGG) which inter alia provides the desired rigidity. A layer of yttrium iron garnet (YIG), doped with lanthanum and gadolinium, was deposited thereon by liquid phase epitaxy (LPE). The composition was $Y_{2.87}La_{0.13}Fe_{3.79}Ga_{1.21}O_{12}$. This layer had a thickness of 2.7 microns and serves to accommodate the configurations of magnetic domains. Without external bias magnetic means, a rather arbitrarily arranged pattern of strips occurs in such a layer, successive strips having alternating magnetization directions. In this case the width of these strips amounted to 6 microns. The shape of the strip pattern is co-determined by crystal defects and impurities which are virtually always present. The collapse field strength amounted to 28 oersted. At this field strength the entire plate is magnetized in one direction. The magnetic length had a value of 0.79 microns. This length is defined as the ratio between the domain wall energy per unit of wall surface area and the magnetostatic energy per unit of material volume (see S. H. Bobeck et al, Magnetic Bubbles, North Holland, Amsterdam, 1975, page 2, line 28 and further). The quantity $4\pi$ Ms had a value of 130 oersted. In accordance with FIG. 3, there are mainly two different magnetization configurations. For example, the non-disturbed (dataless) configuration consist of strips which extend in the direction DE. Successive strips have alternating magnetizations, directed transversely to the plane of the drawing, as denoted by a diagram at the right of the Figure. "Transverse to" is to be understood to mean herein "perpendicularly to" and limited deviations therefrom, as is common in magnetic bubble technology. The widths of the "black" and "white" strips, in a condition of equilibrium, are substantially equal in the direction E-F and correspond to approximately the diameter of an isolated and stable magnetic bubble in the material used for a bias magnetic field which has a magnitude between that of the collapse field and the run-out field. The pattern of parallel strips is not completely stable due to the influence of deviations in the material of the plate. On the other hand, the instability is not very high, because the repelling forces between strips of similar magnetization direction have a stabilizing effect. Moreover, a small wall length is favorable from an energetic point of view. The domain walls exhibit an effect which is analogous to the surface tension of liquids. Finally, in many cases it will be difficult to move a domain/background region wall from a location where the layer has crystal defects, (the wall will be pinned in this location). Often a pattern of parallel strips, once formed, is then reasonably stable, even if no further steps are taken.

When a layer having a magnetization configuration as described is used in a memory device, the magnetization configuration is stabilized by a layer of permanent ferromagnetic material which is arranged along the layer of yttrium iron garnet. This may be a magnetic tape which in known manner contains ferromagnetic grains which are embedded in a layer of a synthetic material which is flexible or not. The dimensions of the grains are small relative to the periodicity in the direction EF of the magnetization configuration of the layer for the data storage. The stabilizing layer may also have a continuous structure, for example, in that it is made by vapor deposition. The magnetization of the magnetic tape or of a suitable rigid plate is realized in known manner. Use can be made of a recording head comprising a recording gap which extends in the direction DE and which moves at a uniform speed in the direction EF relative to the tape, the coil being driven by appropriate pulse-shaped current signals. The magnetization of the tape then has an alternating direction with narrow transitional zones between these regions. The magnetization can be effected on the spot, for example, in a device as shown in FIG. 1, the recording head is then moved underneath the layer 10. On the other hand, the ferromagnetic layer may also be pre-magnetized elsewhere. FIGS. 24a, 24b, 24c, and 24d in this respect show a cross-sectional views of the magnetic layers of a magnetic domain device. The layer 210 is the stabilizing layer of permanent magnetic material. It comprises strips which extend transverse to the plane of the drawing. These strips are alternately magnetized to the left and to the right in FIG. 24a. The layer 211 contains the magnetization configuration in which data can be stored. The domain walls are denoted therein by broken lines. The magnetization in the layer 211 is directed alternately upwards and downwards. The magnetic structure of these domain walls is not shown. This structure may correspond to that of so-called "soft" magnetic bubbles. Said domain walls coincide approximately with the center of the relevant magnetized strips in the layer 210. The purpose and the function of the layer 212 will be described in detail hereinafter. The layers 210, 211 may have a magnetically fine-structure in a direction transverse to the plane of the drawing. This will also be described hereinafter.

The strips near the area E of the plate of ferrimagnetic material in FIG. 3 do not contain data. The strips near F (at least the dark strips), however, contain data. Complications such as at the area M will be discussed with reference to FIG. 6. The strips containing data comprise a number of pairs of walls which extend more or less in the direction EF and which thus constitute an interruption of a "dark" strip. Interruptions of this kind succeed each other in the direction DE at distances which usually form multiples of a basic distance. In the Figure, this basic distance approximately equals the width of the dark (and light) strips in the regions where they do not contain data. At the area of an interruption in a dark strip, it is locally widened slightly. This is most distinct if two interruptions succeed each other at a single basic distance. This is because in the absence of a general background (bias) magnetic field, both magnetization directions in the plate 9 must cover approximately equal parts thereof. An interruption in a strip in this case increases the light surface area thereof, which must be reduced elsewhere again. The shape of the roundings is again determined by the properties of the domain walls which are analogous to those of the surface tension of liquids.

In FIG. 3, the interruptions in two neighboring dark strips may be alternately arranged, i.e. shifted over one half basic distance in the direction DE. A further possibility is that they occur in directly opposite positions. Other mutual positionings may sometimes also be advantageous. The locations where an interruption can occur in a dark strip thus form elements of a regular array. It is also possible to provide the "light" strips with data by interruptions. It is even possible to simultaneously use both types of coding without disturbing interaction, as is shown for the sake of clarity at the area M. The generation and the detection of the domain configurations will have to be adapted to the geometry thereof. The magnetization of the layer 10 has a number of parameters which co-determine the use of the layer 9. First of all, the coercive force of this permanent magnetic layer must be sufficiently high. This may correspond, for example, to a value of approximately 200 oersted. This ensures that once a magnetization has been introduced therein, it will not be changed readily. The field strength induced in the layer 9 is also important. The amplitude of the component thereof which extends transverse to the layer 9 varies approximately sinusoidally in the direction EF. The sign of the peaks corresponds to the magnetization in the domain configuration. If the peak value is above a locally relevant collapse field strength, the interrupting of a magnetized strip is inhibited, so that no data storage is possible. This level may differ from the previously mentioned collapse field strength, because the latter concerned an isolated "bubble" domain. A lower limit for the field strength is given by the fact that the regularity shown in FIG. 3 must be maintained in all circumstances. Attractive values have been found in the region between 10 to 25 oersted. The location of the operating region is determined by the magnetic parameters of the layer 9 and by the mode of use of the memory device. Comparatively low values are chosen if the domain configuration in the plate 9 is driven. A strong stationary field impedes the transport of the domain data. Comparatively high values are chosen in the case of a domain configuration which is stationary relative to the layer of magnetic material. In the case shown, the driving became impossible at peak fields of approximately 50 oersted (thus, the configuration is stable against higher maximum field values than the uniform collapse field value for an isolated bubble). In this respect, the article by Calhoun describes that the stability region of an array of bubbles in a uniform magnetic field requires a typically five times lower field strength than that for an isolated column of magnetic bubbles. This concerns, however, a uniform magnetic field and hence a completely different mechanisms. In the configuration according to the invention, successive strips of alternately oriented magnetization have a stability-increasing effect. The second important parameter of the magnetization pattern is the period of the alternately magnetized strips. An attractive region has strip widths which are substantially equal to the strip widths of the region in the non-disturbed condition, that is without a bias magnetic field. In the above described example, the strip width is approximately 6 microns and therefore there is a period of 12 microns. The strip widths may be larger or smaller, but if the deviation from the equilibrium value is too large, the amplitude of the externally applied magnetic field must be increased. This means that the driving of the domain configuration becomes more difficult.

Figure 4:
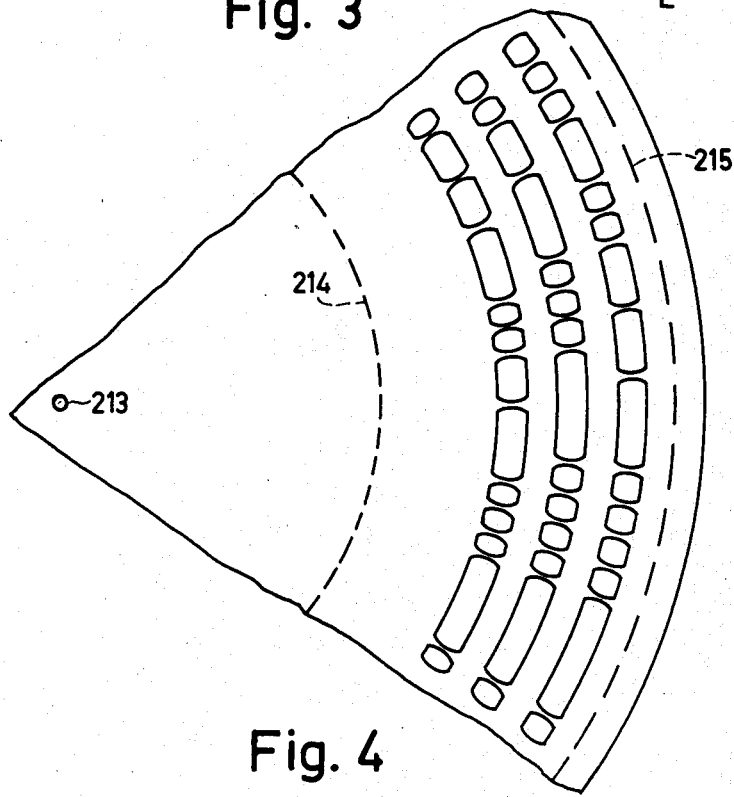

FIG. 4 shows a second magnetization configuration. In this case again strips of alternate magnetization direction are present. These strips, however, now form concentric tracks. The interruptions are situated in fixed, periodically arranged, tangential positions. The external magnetization pattern then also exhibits radially successive strips of a magnetization which is oriented, in the layer corresponding to the element 10, alternately towards the centre 213 and away from this centre. The region of the disc to be used is bounded, for example, by the circles 214 and 215. Generally, a large number of concentric tracks can be accommodated. The diameter of the circle 215 is, for example, 30 cm, while that of the circle 214 amounts to, for example, 23 cm. The periods and hence the track width being in the vicinity of 12 microns. This results in approximately 5000 tracks. Each track can accommodate approximately $1.5 \times 10^5$ interruptions, so that the disc can accommodate $10^9$ bits. The capacity can be further increased by choosing a smaller period. Means for the tangential stabilization can again be added. These means will be described hereinafter. Furthermore, centering and tracking means can be provided. These means can be realized in known manner, for example, by the optical properties of optically detectable recesses, for example, in a number of concentric tracks comprising dips. The adjustment of read and/or write elements is described, for example, in U.S. Pat. No. 3,876,842, which is incorporated herein by reference.

Figure 5:
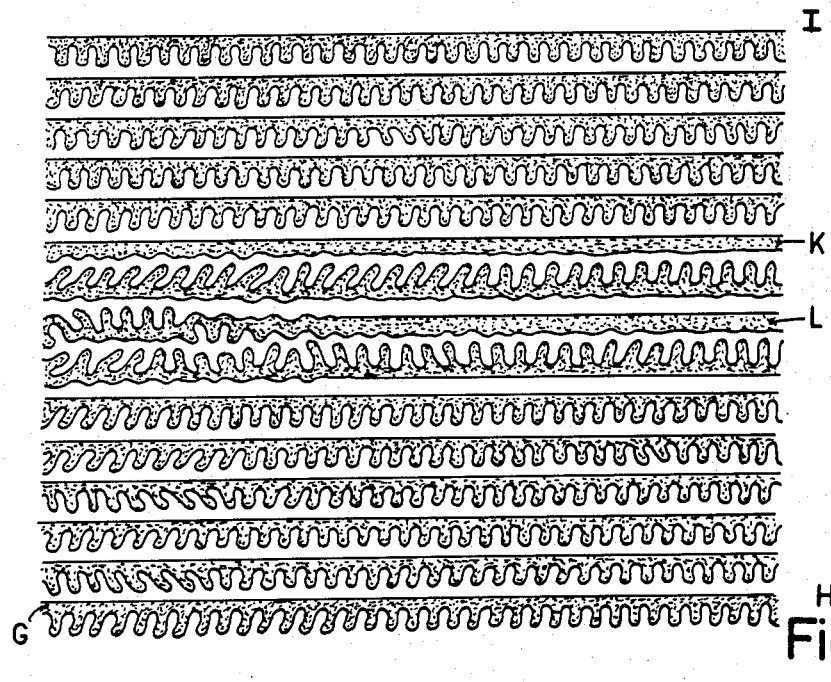
Figure 6:
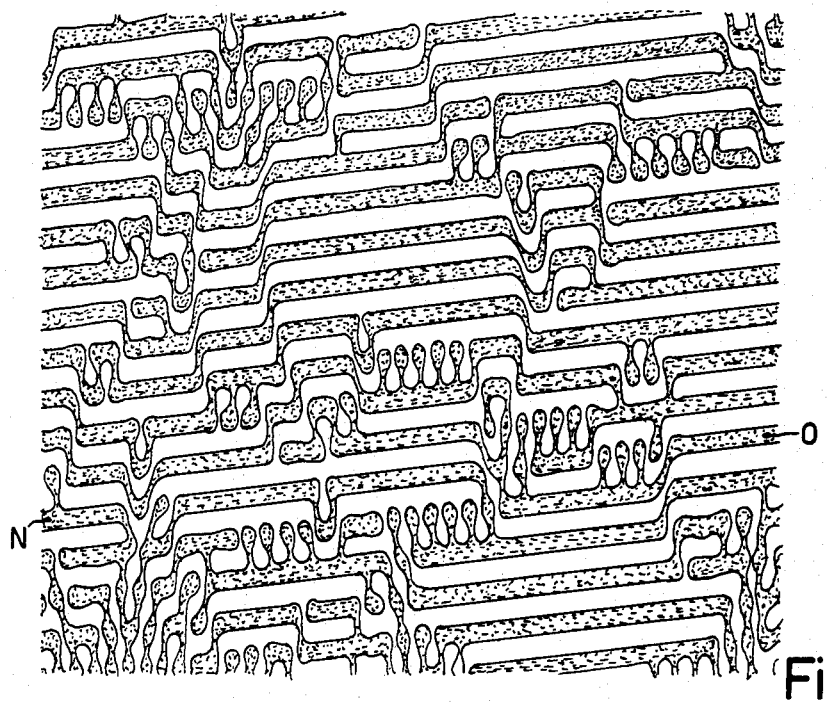

FIG. 5 shows a third magnetization configuration of the layer 9 of FIG. 1. The period of the magnetization configuration of the layer 10 is chosen to be larger, as is indicated adjacent the Figure. The positioning and preparation of the layer 10 is again effected in the described manner. The surface area of the light strips is again approximately equal to that of the dark strips in FIG. 5. As a result of the larger period of the magnetized strips in the layer 10, the stability of straight domain walls is lower. On the one hand, this stability can be restored by an increase of the field amplitude as has already been stated. However, this embodiment utilizes the modified stability. A strong tendency towards meandering strip walls exists. The length of a period of the meanders amounts to approximately twice the minimum width of a strip. The transverse dimension of a meander period (in the direction HI) amounts to approximately 1½ to 2 times this minimum width. Furthermore, these meanders are connected to strips which otherwise extend mainly parallel to the direction GH. Protrusions of successive, for example, dark strips can be present in the same positions along the direction GH. However, it is also possible for these protrusions to occur in an alternating manner, each time shifted over one half period. The data embodied in the magnetization configuration can be present in the number of successive protrusions of a single strip, for example, a dark strip. The succession of protrusions of two adjoining strips can similarly express a pattern of zeroes and ones. The possible stability of straight domain walls is in this case expressed by the domains at K and L. The domain L has a straight wall such that three more or less straight domain walls succeed each other. The domain K comprises two straight domain walls, the protrusions extending from the two neighboring domains being directed thereto on both sides, FIG. 6 shows a fourth magnetization configuration (see also the region at M in FIG. 3). Notably, wider use is made of the various described possibilities of using protrusions and interruptions. The period of the magnetization configuration of the layer 10 again corresponds to the period of the dark and the light strips which extend mainly in the direction NO. These strips may be interrupted like in FIG. 3. When two interruptions of a strip occur at a short distance from each other, the intermediate piece in this case either forms a protrusion of one of the neighboring paths in the same manner as described with reference to FIG. 5, or the intermediate piece is connected by at least one bridge to at least one neighboring strip of the same kind. In this respect a number of strips can be connected to the next strip. It appears as if the entire pattern then performs a step over one period of the periodic configuration, transverse to the direction NO. It is also possible for a kind of transverse path to be formed, which comprises a protrusion at the area of the corresponding (light or dark) strip in the direction NO. FIGS. 7-15 show details of the magnetization patterns in this respect.

FIG. 7 shows an interruption in a strip (cross-hatched to be dark). An interruption of this kind may represent a binary "1". The local bias magnetic field is insufficient at the area of the strip to cause collapsing of the interruption. The roundings of the interruption are determined by two opposing forces. On the one hand, the externally applied magnetic field tends to narrow the interruption. On the other hand, the shaded regions tend, by demagnetization, towards an as short as possible domain/background wall, analogous to the surface tension of a liquid. This would cause widening of the interruption.

FIG. 8 shows two successive interruptions in a strip, for which four domain walls which succeed each other in the direction of the strips are present. A configuration of this kind can represent a binary information "11". One of these "1" data can also be used as a location determinant for one or more other interruptions in the same manner as sometimes an upper limit is imposed for digital codes as regards the number of directly successive "0" data. Thus, the absence of an interruption in this case represents the digital value "0". The isolated piece in FIG. 8 behaves on the one hand as an isolated magnetic bubble, for example, due to the "surface tension" effect. As a result of this surface tension, the isolated piece will not collapse. This is ensured by the external magnetic field and also by the internal energy of the magnetization in this region. A domain will not collapse if no external magnetic field is applied. Furthermore, the shape deviates substantially from the circular shape, in that the adjoining pieces of the same strip and of the successive strips of opposite magnetization exert a compressive force. This causes flattening and the shape will be between that of a circle/ellipse and that of a square/rectangle.

FIG. 9 shows the complement of FIG. 7 in the form of an interruption of a light strip. Thus, such a light strip can also contain data. It is possible for the elements of FIG. 7 and those of FIG. 9 to occur independently of each other in one and the same layer of magnetic material. On the other hand, FIG. 9 could also be obtained from FIG. 7 by manipulating the polarizer and the analyzer.

FIG. 10 shows an interruption in both of two successive strips. The successive interruptions are now situated approximately one half strip width apart. Like the configuration shown in FIG. 8, this configuration can also represent the information "1 1", but it is arranged to be more compact in the direction of the strip. Now, two-bits of information require only a length which approximately equals the width of a strip. The interruption in the light strip is again flattened in this case. Furthermore, the shape of the transition between an interruption in a dark strip and a bridge across a lighter strip is strongly influenced by the transition of the magnetization pattern controlled by the ferromagnetic layer. These transitions and starts are smooth, but cannot be represented by a simple mathematical relationship.

FIG. 11 shows an elaboration of FIGS. 8 and 10, in that the dark strip comprises two interruptions, while the intermediate piece thus isolated is connected to the next dark strip by a bridge.

FIG. 12 shows a further elaboration thereof, in that the isolated intermediate piece is connected to both adjoining dark strips by bridges. In this and subsequent configurations it is possible, for example, for the interruptions in the dark strips to contain the information (0, 1). The interruptions in the light strips can then co-function, or function exclusively, for indicating the positions in which a bit position (for 1 or 0) is situated in neighboring strips. In the configurations shown in FIG. 10 and subsequent configurations, a phase shift occurs between successive strips. The "bridges" across a light strip are staggered over one half period relative to the positions for a possible interruption in a dark strip. Interruptions in dark strips, therefore, can be present in array positions of a rectangular array. In configurations which are elaborations of FIG. 8, because the dark strips are interrupted exclusively, more possibilities exist, because there is only a slight coupling between the interruption pattern in successive strips. First of all, the interruptions positions can be shifted over one half period in successive strips. Such a period is found in FIG. 8 as the length in the strip direction of the isolated piece, increased by the dimension of an interruption. The additional stability is that such isolated pieces are usually slightly wider than a non-disturbed strip, and the strips of similar magnetization direction (and also isolated pieces thereof) repel each other in the manner of magnetic dipole configurations. On the other hand, in the case of the occurrence of interruptions exclusively in one of the two categories of strips, these interruptions can also form a rectangular array. As will be described hereinafter, the stability can also be maintained by external means.

Figure 13:
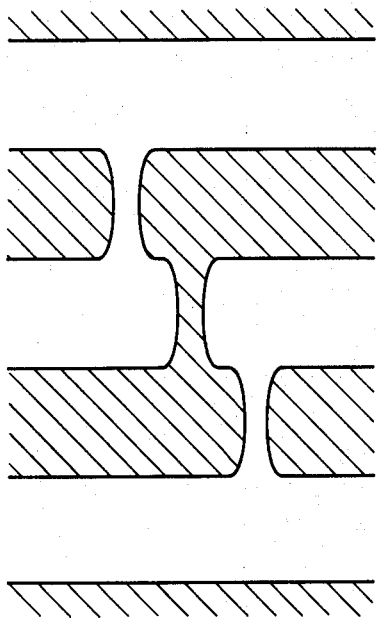

FIG. 13 shows a more complex pattern for three successive strips, the outer "dark" strips being interrupted and two of the pieces being connected by a bridge. Each of the interruptions is situated on a different side of the bridge. The data pattern tern may be represented as a 10/1/01.

Figure 14:
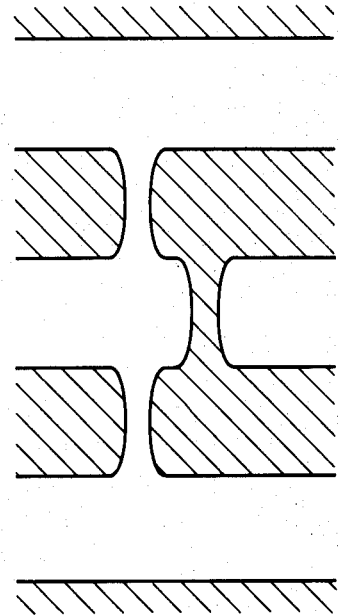

FIG. 14 shows a slightly different magnetization pattern. The interruptions are now situated on the same side of the bridge and the data pattern can be represented as: 10/1/10.

Figure 15:
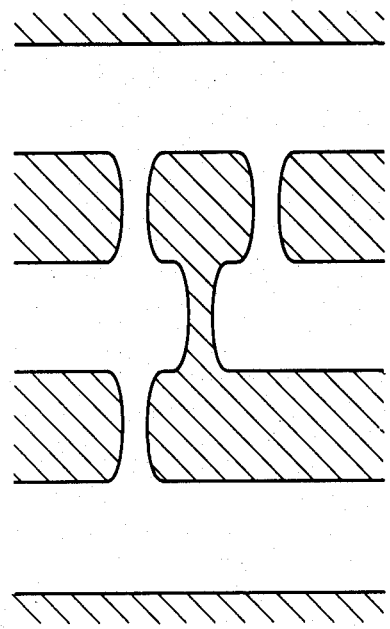

FIG. 15 shows a further magnetization pattern in which on one side an isolated piece is connected, by way of a bridge, to a strip which is also interrupted. The data can be represented as 11/1/10. In the cases shown in the FIGS. 13-15, given interruptions/bridges can also serve for fixing the array points in order to protect later detection. In given cases, for example, like in the FIGS. 3, 4, 5, only part of the number of feasible interruptions/bridges is used for advantages yet to be described. In the case of FIG. 5, the transverse dimension of the strips may be comparatively small and the data can be stored according to FIG. 11. A very stable configuration is obtained if the isolated pieces are always connected to one of the two adjacent strips of the same magnetization direction. In that case the configuration shown in FIG. 11 represents, for example, the information "1". In that case it is sometimes advantageous for the magnetization of the ferromagnetic layer 10 to be such that strips of corresponding magnetization direction, but of alternately stronger and weaker magnetization suceed each other in the layer 9. Thus, the following three basic patterns are possible, which can be composed of the elementary patterns shown in FIGS. 7–15:

(a) longitudinal paths with interruptions, so that selective isolated path sections arise;
(b) longitudinal paths with protrusions, without additional connected paths being formed thereby;
(c) longitudinal paths with protrusions reaching as far as positions of neighboring paths, and bridges between different paths.

The Generation of the Domain Configuration

Various methods are known for generating magnetic bubbles, i.e. approximately disc-shaped magnetic domains. For example, U.S. Pat. No. 3,958,211 describes a method whereby a bias is split by local influencing of the main magnetic field which is directed transverse to the plate of ferrimagnetic material. Within a current loop two separate perferred positions exist for a bubble, the preferred positions being formed by small regions of permalloy vapor-deposited on the layer. A bubble present is enlarged by a reduction of the locally present transverse magnetic field so that both preferred positions are simultaneously covered. If the transverse magnetic field is subsequently increased again, the bubble is split, a split off bubble being automatically discharged, outside the current loop, along a rail-shaped preferred structure. Such a rail-shaped preferred structure may very well be formed by a strip of material magnetized by a deposited ferromagnetic layer, the magnetization direction of the strip corresponding to that of the introduced domain. As described in the Patent, no further drive means are used, because driving is realized by the mutual repulsion of the domains. In the absence of pinning points, caused, for example, by crystal defects of the ferrimagnetic layer 9, in principle an indefinite number of domains can thus be serially formed. Further drive means will yet be described. The Patent describes an arrangement comprising a uniform background magnetic field, but it will be obvious that at the level of a single bubble only the locally present transverse magnetic field is of importance. As a result of the hysteresis of the ferromagnetic material, external means are capable of reversibly reducing the total magnetization. If the ferromagnetic material is saturated, the local magnetization can also be reversibly increased. If this saturation is not present, the field increase in second instance may not exceed the field strength originally present.

In addition to the foregoing, U.S. Pat. No. 3,905,040 discloses a further method of generating magnetic bubbles in a region with a uniform background magnetic field (for which the same holds true as above) by means of a locally applied pulse of laser radiation. If the temperature first increases to above the so-called compensation temperature of the ferrimagnetic material, a bubble is produced when the compensation temperature is again reached as the local area of the ferromagnetic materials cools. Thus, a domain is directly created instead of being split off. The temperature rise can be accompanied by a local reduction of the bias magnetic field. The compensation temperature can be explained as follows. The yttrium iron garnet (YIG) has a mainly cubic structure comprising three sub-crystalline lattices in which other ions can be substituted. The dodecahedral lattice is formed by the yttrium ions with partial substitution by lanthanum. The octahedral sub-crystalline lattice contains 40% of the iron ions with partial substitution by gadolinium. The tetrahedral sub-crystalline lattice contains the remaining 60% of the iron ions (in this case again with some substitution by gadolinium). The magnetization of the dodecahedral sub-crystalline lattice may usually be ignored, as with the magnetization of the oxygen ions. The total magnetization then equals the vectorial sum of the magnetizations, of the tetrahedral and octahedral sub-crystalline lattices which are substantially oppositely directed. These magnetizations are temperature-dependent and have different temperature coefficients. They exactly cancel each other at the compensation temperature.

The latter method of forming a magnetic bubble can also be used for generating a strip-shaped domain in a background region having a magnetization of opposite direction. The impact position of the laser radiation must then describe a strip-shaped path. In this case the generating of the strip-shaped domain may be a continuous process.

When the local magnetic field is sufficiently increased, a bubble or other magnetic domain configuration can be caused to collapse.

Hereinafter, a description will be given of a number of examples of devices for providing the domain configurations thus generated with digital information. The description is initially based on non-disturbed magnetization strips as shown in part of FIG. 3. FIG. 16 in this respect shows two dark magnetization bands 11, 12 which are magnetized in the first direction, transverse to the plate of magnetic material situated in the plane of the drawing, and which are separated by a light magnetization band in the opposite direction. The conductor 17, having more or less the shape of a horseshoe, is arranged on or near the plate. When a current is passed through this conductor in one direction, the magnetic field in the cross-hatched region 18 is intensified. It is assumed that the light region at the bottom of the Figure extends beyond the sphere of influence of the loop 17. This increase of the transverse magnetic field does not influence the magnetization configuration in the cross-hatched region 18, because both magnetization directions correspond. Outside the cross-hatched region, the field inside the loop is reduced and can reverse its direction in a transition region. As a result, the region 18 can reversibly expand until it fills a larger part of the loop 17 or even the entire loop. After termination of the activation, this growth is reversibly cancelled, because the light region can then expand again as far as inside the loop, starting from the outer region. If, furthermore, the current through the loop is not excessively large, there are no consequences as regards the magnetization configuration outside the loop 17. The change of the magnetic field strength is smaller outside the loop than inside the loop. If the loop is activated in the other direction, the magnetic field in the region 18 can be reversed, and if increased to the collapse value, the magnetization direction in the information layer is reversed. The strip 12 is then interrupted and this condition cannot readily be reversed. In the permanent magnetic layer 10, the coercive force is so high, that this layer maintains its original magnetization. The outer region of the loop 17 need not be affected by the latter activation. After termination of the activation, the dark strips expand in the longitudinal direction as far as inside the loop 17, until they have approached each other with only a slight interruption in the way of FIG. 7, so that a binary information "1" is written.

FIG. 17 shows a double version of a device as shown in FIG. 16. If the magnetic field in the cross-hatched regions 20, 21 increases to the collapse value due to activation of the loop 19, an isolated part is formed in the strip 12 in the manner of FIG. 8. The part between the two parts 20, 21 need not be subject to irreversible changes upon activation, as for the first activation described with reference to FIG. 16. The opposite activation of the loop 19 does not make much sense, because expansion of the regions 20 and 21 can cause a bridge therebetween via the dotted line. Any collapse of the intermediate region between the parts 20, 21 is then restored by the straightening of this bridge, so that the previous condition is restored. Thus, the configurations shown in the FIGS. 7, 8, 9 can be generated.

A completely different method of introducing the information is based on a "domain array" according to the upper part of FIG. 3. All "dark" strips comprise a series of isolated parts, the dimension of which in the longitudinal direction of the strip corresponds approximately to the width of one strip. If subsequently such an interruption is heated beyond the compensation temperature of the ferrimagnetic material by a brief exposure with a laser, as stated above, the interruption will disappear and it will not return when the temperature decreases. Thus, a pulse of laser radiation can always locally reorient the magnetization of the ferrimagnetic layer to the same direction as the magnetization locally induced by the contacting permanent magnetic layer. This is applicable to the formation of bubble-like domain configurations as well as to the elimination of interruptions.

FIG. 18 shows an elaboration of FIG. 17, in that the loops extend up to the band 11. When the conductor 35 is activated in a first direction, the field at the cross-hatched areas 36, 37 can be reversed and can become so high that the collapse limit is exceeded at these areas, so that two interruptions are formed. At the area of the cross-hatched region 38, the field can also reverse its direction and can subsequently exceed the collapse limit. The strips 11, 12 then locally expand so far that a connection is formed between the strips 11, 12. After termination of the current pulse, the interruptions and the bridge formed are permanent in order to form a configuration like that of FIG. 11. The effect of the current pulse at the right and the left of the forked loop is generally insufficient to form further bridges across the light strip; at these areas the field of only one leg is strongly active and, moreover, partial compensation is also provided by the fields of successive legs. The activation of the conductor 35 in the opposite direction is not useful for the same reasons as described with reference to FIG. 17.

FIG. 19 shows a still further set-up. When the conductor 28 is activated in the one direction, an interruption is formed in the cross-hatched region 29 and a bridge is formed in the cross-hatched region 30. This is effected in the same manner as described for the cross-hatched regions 36 and 38, respectively, of FIG. 18. In the case of activation in the other direction, a bridge can be formed at the area of the region 29A and an interruption can be formed at the region 30A (the region 29A will then have to cover a small part of the non-disturbed strip 11). Thus, reversal of the information stored is possible by reversal of the activation direction. The changes are irreversible. In the second case, the path 11 will not be readily interrupted, because at this area there are no two legs of the conductor 28 situated near each other. Thus, a configuration similar to that shown in FIG. 10 is formed.

FIG. 20 shows an elaboration of FIG. 19. When the conductor 31 is activated in a first direction, an interruption is formed in the shaded regions 32, 33 and a bridge is formed in the region 34. This takes place in the already described manner. Activation of the conductor 31 in the other direction similarly produces two interruptions in the paths 11, 12 and a bridge therebetween. Thus, a configuration is formed which is similar to that shown in FIG. 14 and which is again stable.

FIG. 21 shows an elaboration of FIG. 20. When the conductor 22 is activated in a first direction, interruptions are formed in the shaded regions 23, 24, 26, 27 and a bridge is formed in the region 25. This takes place in the described manner. The configuration is somewhat similar to that of FIG. 15, except that the bridge is now present between two otherwise isolated regions. Correspondence with FIG. 15 would be achieved if one half of the fork-shaped loop is shortened so far that the region 26 is situated outside the loop. When the conductor 22 is activated in the other direction, both strips 11, 12 are interrupted at the area of the region 25, while on either side thereof a bridge is formed. The configuration formed is the complement of that shown in FIG. 12 if "dark" and "light" strips are interchanged. Both configurations thus formed again stable.

The generation of the configuration shown in FIG. 13 is not shown. This can be realized by means of a multi-layer conductor which comprises only the regions 24, 25, 27 in FIG. 21. These regions are then magnetized in alternating directions, in that the activation conductor each time crosses itself between two successive regions. A double-meander conductor extending over 45° is effectively thus formed.

In each of the foregoing examples, the desired domain wall configurations were simultaneously formed. The successive formation of such configurations will be discussed hereinafter (in addition to the above described formation coupled with sequential addressing of the domain positions by a laser device). In a device according to the invention, a single generator device as shown in any one of the FIGS. 16-21 may be present, the associated conductor introducing information by activation or non-activation. On the other hand, several, different generators of this kind may be present. The activation of a selected generator then introduces one of the feasible types of different data.

Devices as shown in the FIGS. 16-21 can be used for introducing information in a non-interrupted magnetic domain strip by way of interruptions and/or bridges. Similarly, interruptions and/or bridges can be removed. For example, if the region 18 in FIG. 16 comprises an interruption, it can collapse if the local magnetic field transversely of the plate is increased. The other ones of the devices can introduce modifications in the magnetization pattern in a similar manner.

FIG. 22 shows a magnetization configuration similar to that of FIG. 5. The period of the magnetization in the permanent magnetic layer is so large that straight domain/background region walls readily exhibit undulations. On the other hand, this period is so long that interruptions, or bridges between the strips are not readily stable. In some cases exceptions to the foregoing are possible (see, for example, the substantially straight domain strips at K, L in FIG. 5). In FIG. 22 the logic significance "0" can be attached to each tail of the strip 15 in the direction of the strip 16, while the logic significance "1" can be assigned to each tail of the strip 16 in the direction of the strip 15. The configuration shown in FIG. 22 then contains the information 00001011 from left to right. The sides of the strips 15, 16 which are remote from each other are in this case (substantially) straight. Two subsequent strips can again comprise a similar pattern of tails containing information. The information may also be considered as being embodied in the "light" strip 216 which thus has two appearances: there are parts which comprise, in the same manner as the "dark" strips, straight parts with transversely directed tails and there are also parts in which the light strip 216 itself is shaped as a meander. A further configuration for a strip is also possible. This configuration comprises a nominally straight part with tails containing information on both sides.

The information in the described configuration can be modified as follows. When the conductor 39 is activated in the one direction, the field in the shaded region 41 can be reversed and subsequently increased beyond the collapse field strength. As a result, a connection is formed between the band 16 and the region 40. At the same time, the field strength in the region 42 can be increased beyond the collapse value. In this respect, the magnetization of the ferromagnetic layer present at this area can also contribute. As a result, the connection between the strip 15 and the region 40 is interrupted. After termination of the activation of the conductor 39, the region 40 remains connected to the path 16 in a stable manner. Activation of the conductor 39 in the reverse direction does not always make sense, because in some circumstances an interruption could occur in the path 16. A mixture of the configurations shown in FIG. 5 and FIGS. 3 and 6 could then occur. In some applications, a mixture of this kind will be advantageous.

The domain configurations shown in the FIGS. 5 and 22 have a further advantage. In these figures no upper limit is imposed on the number of successive elements of one of the two values in a series. This is because there is always a bridge between the central region (40) and one of the contacting paths. Similar arguments are applicable to other configurations. For example, the configuration shown in FIG. 12 comprises, for example, four elements: two interruptions and two bridges. If one of these four elements fixes the location, the other three elements can be chosen at random.

In the foregoing, the generation of the domain configuration with laser radiation and by locally influencing the externally present magnetic field has been described. It is also possible to generate a general domain configuration. First of all, an auxiliary permanent magnetic layer having a strip-shaped magnetization pattern can be placed adjacent to the layer 9 and subsequently be removed again. If the strip pattern in the auxiliary layer corresponds to that in the layer 10 and if the magnetization is sufficiently strong, this method produces a non-disturbed strip pattern substantially as shown in the lower part of FIG. 3. This pattern can be maintained in the layer 9 upon removal of the auxiliary layer. The additional field, due to the auxiliary layer, should not be so strong that the coercive force of the layer 10 is exceeded. In additional, it is also possible to remove the layer 10 temporarily and to apply it again at a later stage. Ample tolerance exists in the direction of the strips for the shifting of the magnetization patterns with respect to each other. This tolerance is smaller transverse to the strips, but in most cases ¼ of the strip width is an acceptable tolerance. Sometimes it is easy to impart a lateral displacement to the complete strip pattern and in that case the said tolerance may be larger. Thus, a "blank" strip pattern is formed. The magnetization pattern in the auxiliary layer may have the same structure as the layer 210 of FIG. 24a and may be provided in a corresponding manner. The positioning of the auxiliary layer can be realized by means of simple mechanical means. The positioning of, for example, a piece of magnetic tape is commonly performed and is not elaborated on herein for the sake of brevity. It may be material similar to that of the layer 10 of FIG. 1, but the magnetization is stronger and corresponds, for example, to the saturation magnetization. The saturation magnetization may correspond to that of the layer 10, but may also be higher or lower.

The auxiliary layer can subsequently be removed and can be applied again after rotation over a predetermined angle. As has already been stated, a blank strip pattern can meanwhile be sufficiently stable, even in the absence of external magnetic means (layer 10). The angle may have a value of substantially 90°. Other angles are also suitable, for example, from 60° upwards. If the magnetization is sufficiently strong, the magnetic field in the plate 9 can locally rise beyond the collapse value due to the external means. Consequently, interruptions occur in the domain strips which may be permanent and stable after removal of the auxiliary layer. The interruptions can occur in both strips of domain region as well as background region. It is also possible to generate only one of the two categories, if desired. This can be realized by applying a weak uniform magnetic field transverse to the plane of the plate 9, with the result that one of the two magnetization directions therein is more stable against interruptions. This transverse field may have a value of, for example, 10 oersted. After the specific pattern has been provided, it can be removed. The pattern shown in the upper part of FIG. 3 has thus been generated. The pattern in the lower part of FIG. 3 has remained undisturbed due to manipulation of the separation between the auxiliary layer and the plate 9. The separation was slightly larger at this area. It is alternately possible to provide only strips of one magnetization direction in the plate 9 by way of a specific shape of the magnetization pattern in the auxiliary layer. This is possible in that the externally applied magnetic field peaks are not equal in both directions. The shape of these peaks can be expressed in one or more Fourier components. A peak is higher in the one direction than in the other direction as a result of a higher order Fourier component.

The basic pattern of magnetization on which FIGS. 4-6 are based can be generated by similar means, after which the data is written therein by specific modification, as can be seen notably in FIGS. 4 and 6. The auxiliary layer of FIG. 4 requires two components having a ring-shaped and a star-shaped magnetization pattern, respectively. The patterns shown in the FIGS. 5 and 6 can be correspondingly modified to form a rotationally-symmetric pattern, just as the pattern of FIG. 3 was modified to produce FIG. 4.

The Propogation of The Domain Configurations

Figure 24A:
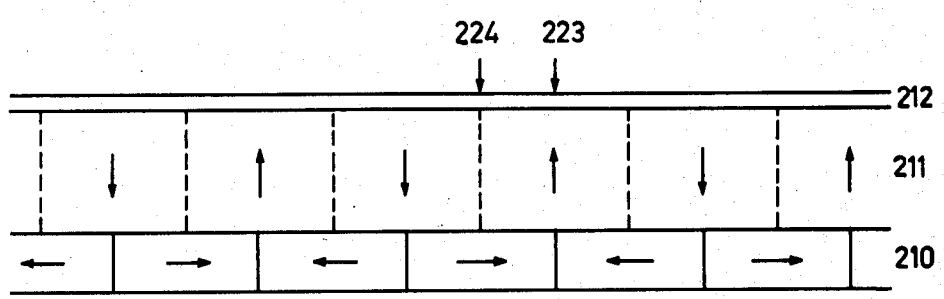
FIGS. 24a, 24b, 24c, and 24d show cross-sectional views of a device according to the invention.
Figure 24B:
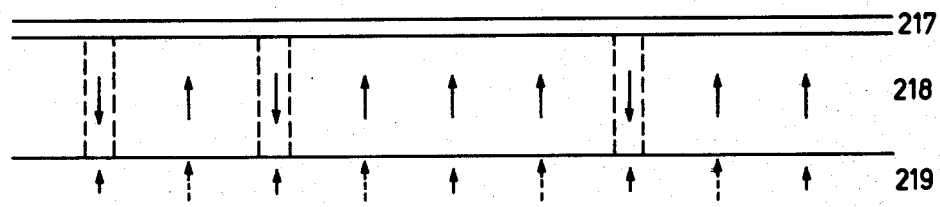
Figure 24C:
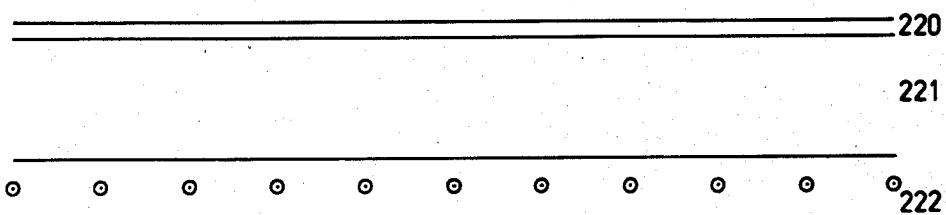
Figure 24D:
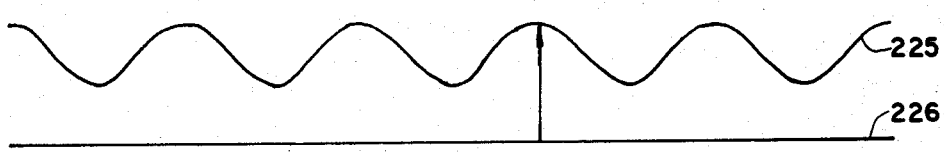

The displacement of the domain configurations and the associated stabilization steps to be taken will be described hereinafter. For some applications, such as the device shown in FIG. 2, the domain configurations need not be displaced. If, moreover, a read-only memory is concerned, no modifications need be made in the configuration either. Stabilization can then be achieved by making movement of the domain walls impossible, for example, by the introduction of pinning points by ion implantation after provision of the data pattern. Furthermore, as has already been stated, FIGS. 24a, 24b, 24c, and 24d show that the stabilization of the domain configuration in the layer 211 is effected by the alternately magnetized strips in the layer 210. These layers 210, 211 and 212 are shown in a sectional view transverse to the strips shown in FIGS. 3 to 6. The layers 217, 218, 219 (FIG. 24b) and the layers 220, 221, 222 (FIG. 24c) represent two sections in the direction of the strips at the areas of the numerals 223 and 224 in the transverse section of FIG. 24a, respectively. At the area of the position 223, the layer of magnetic material 218 contains information in the form of successive pairs of domain walls, the domain strips being interrupted by a narrow piece of background region with downwards directed magnetization vector. The curve 225 in FIG. 24a shows the variation of the magnetization of the layer 210 in a direction along the axis 226 at the area of the position 224 of FIG. 24a. The magnetic field, which varies periodically transverse to the strips (and reverses its direction periodically) is modulated by a second periodic variation along the strips. The amplitude of the second variation amounts to ⅓ of the amplitude of the former variation in this example. This is indicated by larger and smaller arrows in the layer 219 (FIG. 24b). (The magnetization direction at the area 222 (FIG. 24c) is transverse to the plane of the drawing. This latter view shows the interface between two strips in the layer 222.

In layer 219, the externally generated magnetization varies and is denoted by dashed arrows. It will be obvious that the interruptions in the domain strips are preferably present at areas where the externally generated field is weakest. The configuration is then stable. The layers 212, 217, 220 serve for driving a domain configuration and will be described hereinafter.

Figure 23:
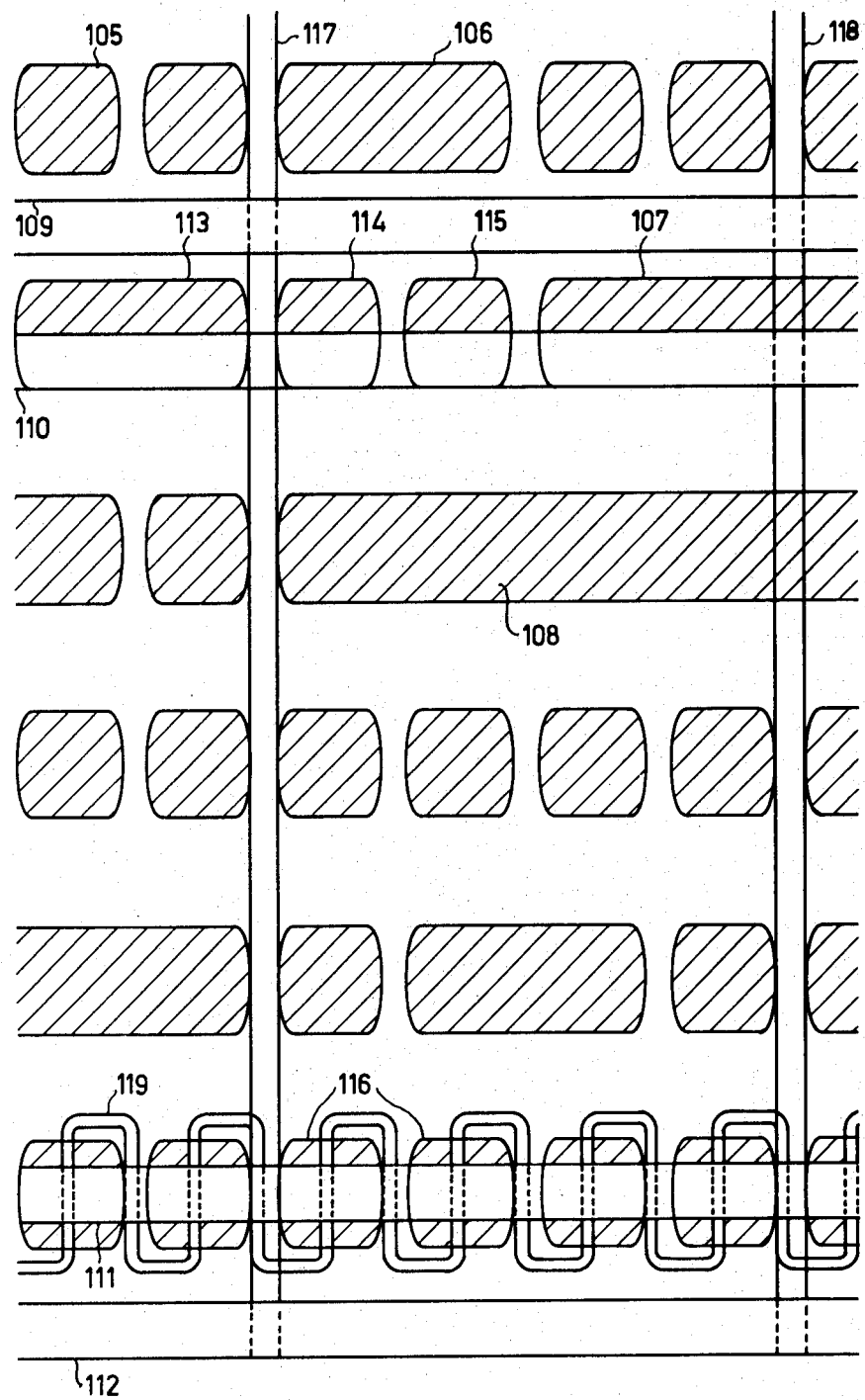
FIG. 23 is a top plan view of a two-dimensional domain region.

FIG. 23 is a two-dimensional view of a domain configuration according to FIG. 3. The figure shows six successive strips in which the preferred direction for the magnetization, produced by the adjoining ferromagnetic layer 10, is directed, for example, upwards transverse to the plate. In these strips, the example shows 32 separate domains which have a corresponding magnetization. These domains are cross-hatched. Between each of these strips there is a strip in which the preferred magnetization direction is oppositely directed. The domain 105 has a length of one period. The domain 106 has a length of two periods. The domain 108 has a length of at least five periods. The dimensions of the other domains are increased apparent by inspection of the figure. The propagation is effected in two directions, for example, in the same manner as described in the article by Calhoun et al for an array of hard and soft bubble domains in a substantially uniform background magnetic field. There is provided a system of conductors, comprising the conductors 109, 110, 111, 112 which are situated in the layers 212, 217, 220. The pairs of conductors are shifted over approximately 4½ periods of the strip structure relative to each other. These conductors are connected to a current pulse generator (not shown) and serve to produce a movement of the domain pattern transverse to the strip direction. If a downwards movement is to be controlled, the conductors 109 and 110 are activated so that the local magnetic field between these two conductors is directed against the magnetization of the domains 113, 114, 115, 107. This increases the potential energy of these domains. As a result of their asymmetrical arrangement, they are driven from between the conductors 109, 110 in the downwards direction in the Figure. The domains 105, 106 et al are also attracted in the same direction, in that a preferred position then arises just outside the pair of conductors. The strips of domains repel each other. Consequently, all other strips are also driven slightly downwards in the Figure. In this direction further pairs of conductors are present, the odd pairs which correspond to the conductors 109, 110 being activated. Furthermore, at the same time activation of the conductors 111, 112 may create a preferred position of the domains 116 therebetween, which intensifies the driving of the domain configurations. For this type of driving, the opposing force of the magnetization configuration of the layer 10 must be overcome. If the latter magnetization is not too strong, this is readily possible without the data of the domain configuration being lost. It is then necessary to compensate for the gradient caused by the layer 10 in the layer 9. The described process results in a shift of the domain pattern over approximately one half wavelength. Activation of the pairs of conductors in the opposite direction is required for driving the pattern one half period further. Subsequently, the pattern can be stabilized again by the magnetization pattern in the layer 10. The latter has remained unchanged due to the high coercive force. The shape of the current pulses in the conductors 109–112 and the distances therebetween may be different. However, stabilization of the data is effected by the periodic fluctuation of the field of the layer 10 in the direction of the strips, as described with reference to FIG. 24. This stabilization can also be realized by other means, for example, by locally influencing the material of the layer 9. This is shown in FIG. 23 in the form of two strip-shaped grooves 117, 118 across which domain walls have difficulty in travelling. These strips can be present once per period along the domain strips.

The device further comprises a meander conductor 119. A periodic current therein can drive a series of domains from the left to the right in the figure, or vice versa. Small elements of permalloy may be necessary to drive the domains in only one direction. Domains can thus be extracted from or introduced into the two-dimensional region shown. Meander conductors of this kind are known. They can be used as shown for transporting "bubble"-like domains. Alternately directed half periods of the current in the meander conductor create preferred positions for the domains in successive loops (one loop is one half period of the conductor). It is possible for the permalloy elements to act in the same way as a mechanical pawl. The stabilization along the strip may, if desired, be omitted at this area. Domains formed by a generator can thus be driven away therefrom or driven towards a detector. The driving by the conductor 119 can be described as acting on the domains. Similarly, it can be described as acting on the domain/background walls. The effects are the same with either visualization. As a result, domains of larger length, such as the domains 106, 107, 108 of FIG. 23, can be driven by the meander conductor 116 without the coherence and hence the data contents thereof being altered. There is only one condition which must be met in utilizing the meander conductors. The local collapse value of the field may not be reached in the meander loops in which the external field is directed opposite the domain magnetization. As has already been stated, this collapse field value may differ from that for an isolated bubble domain. At a short distance from the meander conductor 116, the field thereof has already decreased to such an extent that the domains in the subsequent "dark" strip are not influenced. On the other hand, it is alternately possible to drive two or more strips of domains together. This can be realized if the meander conductor 119 has a width such that while maintaining the same spatial period the desired number of strips is covered. Bridges may then be present between the domains of the successive strips. In that case configurations as shown in the FIGS. 10 to 15 can also be driven. An additional condition then exists in that a domain region which is driven, such as the bubble domains 116 of FIG. 23, may not be connected to domains in an adjoining, non-driven strip. This is because new interruptions or bridges would then be produced, so that the data would be irreversibly mutilated. Similarly, domain configurations as shown in FIG. 22 can be driven in a direction along the strips, the same limitations being applicable for the pattern to be transported.

The two-dimensional domain region described is of limited dimensions. Known steps for creating a boundary can be taken at the edge of the region. These steps may consist in processing of the layer 9 or the provision therein of non-driven or non-drivable domains (for example, by pinning points or material modification). Steps of this kind are known per se, and will not be elaborated upon herein.

Data Extraction

The detection of domain configurations can be realized in known manner. The use of Faraday rotation and the magnetoresistance effect have already been stated. Selective collapse of a part of the domain configuration is a possible method of detection. Reference is made to FIG. 16 in this respect. A detector of this kind then comprises two separate conductors, each of which is shaped like the conductor 17. When one conductor is activated in order to generate an interruption at the area of the region 18, a current pulse is induced in the other conductor. The value of the induced current pulse depends on whether or not an interruption is already present in the region 18. On the other hand, the interruption can also be cancelled by activation in the other direction. The signal induced is then again dependent of the fact whether or not an interruption was present. Activation can also be realized by means of a whole period of a more or less sinusoidal current. The induced signal may then also be more or less symmetrical or non-symmetrical. Detection methods of this kind can also be realized with other loop configurations. In some cases a loop can then supply different kinds of signals, depending on the previously present domain configuration. The detection signals are applied to a known read amplifier and/or discriminator, an output of which is connected to the control device 100 of FIG. 1.

What is claimed is:

1. A memory device comprising:
   a domain layer of magnetic material having a two-dimensional configuration of strip domains therein, said strip domains having domain walls extending substantially perpendicular to a first coordinate direction in the layer and having a direction of magnetization substantially transverse to the layer, adjacent strip domains having substantially oppositely oriented magnetizations;

generating means for generating in the domain layer one or more pairs of domain walls extending substantially along the first coordinate direction; and detector means for detecting pairs of domain walls extending substantially along the first coordinate direction;

wherein the pairs of domain walls extending substantially along the first coordinate direction each comprise an interruption in a strip domain, said interruption extending substantially along the first coordinate direction to the adjacent strip domains of opposite magnetization, said interruptions each comprising a region whose magnetization is substantially opposite to that of the interrupted strip domain.

2. A memory device as claimed in claim 1 further comprising external bias means having a magnetization which alternates periodically in the first coordinate direction and having a period which is substantially equal to the period of the alternating magnetization in the domain layer, said magnetization giving rise to a magnetic field component which is transverse to and in the domain layer in order to stabilize said two-dimensional configuration of strip domains and interruptions in the domain layer.

3. A memory device comprising:
a domain layer of magnetic material having a two-dimensional configuration of strip domains therein, said strip domains having domain walls extending substantially perpendicular to a first coordinate direction in the layer and having a direction of magnetization substantially transverse to the layer, adjacent strip domains having substantially oppositely oriented magnetizations;

generating means for generating in the domain layer one or more pairs of domain walls extending substantially along the first coordinate direction; and detector means for detecting pairs of domain walls extending substantially along the first coordinate direction;

further comprising external bias means having a magnetization which alternates periodically in the first coordinate direction and having a period which is more than two times but less than four times a standard value of strip width which may be produced in the domain layer in the absence of any external magnetic field; and wherein the pairs of domain walls comprise protrusions of strip domains having one direction of magnetization into adjacent strip domains of opposite magnetization.

4. A memory device as claimed in claim 2 or 3 wherein the external bias means comprises a layer of ferromagnetic material adjacent and substantially parallel to the domain layer.

5. A memory device as claimed in claim 1 wherein the magnitude of the magnetic field in the ferromagnetic layer also varies periodically in a second coordinate direction, substantially orthogonal to the first coordinate direction.

6. A memory device as claimed in claim 5 wherein the generating means comprises a current loop for locally varying the magnetic field transverse to the domain layer.

7. A memory device as claimed in claim 5 wherein the domain layer comprises a ferrimagnetic material and wherein the generating means comprises a laser for heating a local area of the domain layer above the compensation temperature.

8. A memory device as claimed in claim 5 wherein the period of the variation of the magnetization of the ferromagnetic layer in the second coordinate direction is substantially equal to the period of the magnetization of said layer in the first coordinate direction.

9. A memory device as claimed in claim 8 wherein the first and second coordinate directions comprise rectangular coordinates.

10. A memory device as claimed in claim 8 wherein said first and second coordinate directions comprise polar coordinates.

11. A memory device as claimed in claim 8 further comprising first propagation means for driving the strip domains in the first coordinate direction.

12. A memory device as claimed in claim 11 further comprising second propagation means to drive a strip domain in the second coordinate direction.

* * * * *

UNITED STATES PATENT AND TRADEMARK OFFICE
CERTIFICATE OF CORRECTION

PATENT NO. : 4,281,396
DATED : July 28, 1981
INVENTOR(S) : JAN ROOS

It is certified that error appears in the above—identified patent and that said Letters Patent is hereby corrected as shown below:

Col. 24, Line 14, Claim 5, Change " 1 " to -- 4 -- .

Signed and Sealed this

Third Day of November 1981

[SEAL]

Attest:

GERALD J. MOSSINGHOFF

Attesting Officer

Commissioner of Patents and Trademarks

UNITED STATES PATENT AND TRADEMARK OFFICE
CERTIFICATE OF CORRECTION

PATENT NO. : 4,281,396
DATED : July 28, 1981
INVENTOR(S) : Jan Roos

It is certified that error appears in the above—identified patent and that said Letters Patent is hereby corrected as shown below:

On the title page, Foreign Application Priority Data "7700270" should read -- 7700720 --.

Signed and Sealed this

Nineteenth Day of January 1982

[SEAL]

Attest:

Attesting Officer

GERALD J. MOSSINGHOFF

Commissioner of Patents and Trademarks